US011581230B2

(12) United States Patent
Ludwig

(10) Patent No.: US 11,581,230 B2
(45) Date of Patent: Feb. 14, 2023

(54) POWER SEMICONDUCTOR MODULE AND A METHOD FOR PRODUCING A POWER SEMICONDUCTOR MODULE

(71) Applicant: Infineon Technologies AG, Neubiberg (DE)

(72) Inventor: Marco Ludwig, Wickede (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/319,131

(22) Filed: May 13, 2021

(65) Prior Publication Data
US 2021/0358820 A1 Nov. 18, 2021

(30) Foreign Application Priority Data
May 18, 2020 (EP) .................................... 20175217

(51) Int. Cl.
*H01L 23/06* (2006.01)
*H01L 21/52* (2006.01)
*H01L 23/10* (2006.01)

(52) U.S. Cl.
CPC .............. *H01L 23/06* (2013.01); *H01L 21/52* (2013.01); *H01L 23/10* (2013.01)

(58) Field of Classification Search
CPC .......... H01L 23/06; H01L 21/52; H01L 23/10
See application file for complete search history.

(56) References Cited

U.S. PATENT DOCUMENTS

| 6,297,549 | B1 | 10/2001 | Hiyoshi |
| 8,354,747 | B1 * | 1/2013 | Kuo ........................ H01L 21/50 |
| | | | 257/738 |
| 2004/0217465 | A1 | 11/2004 | Stolze |
| 2009/0213553 | A1 | 8/2009 | Tschirbs et al. |
| 2016/0351460 | A1 * | 12/2016 | Wan ....................... H01L 23/041 |
| 2016/0352244 | A1 | 12/2016 | Cheng et al. |
| 2018/0184538 | A1 * | 6/2018 | Bayerer ............... H05K 1/0209 |
| 2020/0176348 | A1 * | 6/2020 | Lim ................... H01L 23/49575 |
| 2022/0130773 | A1 * | 4/2022 | Pun ..................... H01L 21/4825 |

FOREIGN PATENT DOCUMENTS

EP 3460837 A1 * 3/2019
EP 3460837 A1 3/2019

* cited by examiner

*Primary Examiner* — David Vu
*Assistant Examiner* — Brandon C Fox
(74) *Attorney, Agent, or Firm* — Murphy, Bilak & Homiller, PLLC

(57) ABSTRACT

A power semiconductor module includes: at least one semiconductor substrate having a dielectric insulation layer and a first metallization layer attached to the dielectric insulation layer; at least one semiconductor body arranged on the first metallization layer; at least one end stop element arranged either on the semiconductor substrate or on one of the at least one semiconductor body and extending from the semiconductor substrate or the respective semiconductor body in a vertical direction that is perpendicular to a top surface of the semiconductor substrate; and a housing at least partly enclosing the semiconductor substrate, the housing including sidewalls and a cover. The housing further includes at least one press-on pin extending from the cover of the housing towards one of the at least one end stop element, and exerting a pressure on the respective end stop element.

16 Claims, 3 Drawing Sheets

POWER SEMICONDUCTOR MODULE AND A METHOD FOR PRODUCING A POWER SEMICONDUCTOR MODULE

TECHNICAL FIELD

The instant disclosure relates to a power semiconductor module, and a method for producing such power semiconductor module.

BACKGROUND

Power semiconductor modules often include a semiconductor substrate arranged in a housing. A semiconductor arrangement including a plurality of controllable semiconductor elements (e.g., two IGBTs in a half-bridge configuration) may be arranged on the substrate. The substrate usually comprises a substrate layer (e.g., a ceramic layer), a first metallization layer deposited on a first side of the substrate layer and a second metallization layer deposited on a second side of the substrate layer. The controllable semiconductor elements are mounted, for example, on the first metallization layer. The second metallization layer may be attached to a heat sink or to a ground surface of the housing. The controllable semiconductor devices are usually mounted to the semiconductor substrate by soldering or sintering techniques.

A cover of the housing is often used to exert a force on the substrate such that the substrate is pressed on the heat sink or on the ground surface of the housing, respectively. In this way, a thermal resistance between the substrate and the heat sink or ground surface may be achieved. However, assembling such semiconductor module arrangements is often cumbersome and there is a risk that the stability of the housing is degraded during the assembly process which may decrease the overall lifetime of the semiconductor module arrangement.

There is a need for a semiconductor module arrangement that provides a good thermal resistance between the substrate and the heat sink or ground surface of the housing, that is easy to assemble, and that has an increased lifetime.

SUMMARY

A power semiconductor module arrangement includes at least one semiconductor substrate comprising a dielectric insulation layer and a first metallization layer attached to the dielectric insulation layer, at least one semiconductor body arranged on the first metallization layer, at least one end stop element, wherein each end stop element is arranged either on the semiconductor substrate or on one of the at least one semiconductor body and extends from the semiconductor substrate or the respective semiconductor body in a vertical direction that is perpendicular to a top surface of the semiconductor substrate, and a housing at least partly enclosing the semiconductor substrate, the housing comprising sidewalls and a cover. The housing further comprises at least one press-on pin, each of the at least one press-on pin extending from the cover of the housing towards one of the at least one end stop element, and exerting a pressure on the respective end stop element.

A method for producing a power semiconductor module arrangement includes arranging at least one semiconductor body on a semiconductor substrate, the semiconductor substrate comprising a dielectric insulation layer and a first metallization layer attached to the dielectric insulation layer, arranging at least one end stop element either on the semiconductor substrate or on one of the at least one semiconductor body such that each of the at least one end stop elements extends from the semiconductor substrate or the respective semiconductor body in a vertical direction that is perpendicular to a top surface of the semiconductor substrate, arranging the semiconductor substrate in a housing, leaving a cover of the housing open, and forming a layer of a casting compound such that it covers the semiconductor substrate and partly fills the housing. The casting compound has a thickness in the vertical direction, and the end stop element has a height in the vertical direction that is greater than the thickness of the casting compound such that a top surface of the end stop element that faces away from the semiconductor substrate or the semiconductor body is not covered by the casting compound. After forming the layer of casting compound, a cover is arranged on the sidewalls, thereby closing the housing. The housing comprises at least one press-on pin, each of the at least one press-on pin extending from the cover of the housing towards one of the at least one end stop element, thereby exerting a pressure on the respective end stop element when the cover is arranged in its final mounted position.

The invention may be better understood with reference to the following drawings and the description. The components in the figures are not necessarily to scale, emphasis instead being placed upon illustrating the principles of the invention. Moreover, in the figures, like reference numerals designate corresponding parts throughout the different views.

DETAILED DESCRIPTION

In the following detailed description, reference is made to the accompanying drawings. The drawings show specific examples in which the invention may be practiced. It is to be understood that the features and principles described with respect to the various examples may be combined with each other, unless specifically noted otherwise. In the description as well as in the claims, designations of certain elements as "first element", "second element", "third element" etc. are not to be understood as enumerative. Instead, such designations serve solely to address different "elements". That is, e.g., the existence of a "third element" does not require the existence of a "first element" and a "second element". An electrical line or electrical connection as described herein may be a single electrically conductive element, or include at least two individual electrically conductive elements connected in series and/or parallel. Electrical lines and electrical connections may include metal and/or semiconductor material, and may be permanently electrically conductive (i.e., non-switchable). A semiconductor body as described herein may be made from (doped) semiconductor material and may be a semiconductor chip or be included in a semiconductor chip. A semiconductor body has electrically connecting pads and includes at least one semiconductor element with electrodes.

Figure 1:
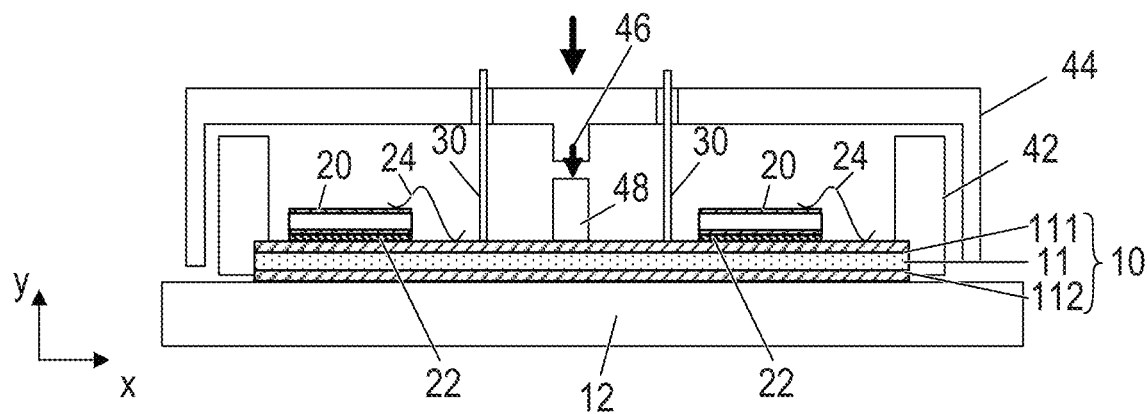
FIG. 1 is a cross-sectional view of an example of a power semiconductor module arrangement.

Referring to FIG. 1, a cross-sectional view of an exemplary power semiconductor module is illustrated. The power semiconductor module includes a housing and a semiconductor substrate 10. The semiconductor substrate 10 includes a dielectric insulation layer 11, a (structured) first metallization layer 111 attached to the dielectric insulation layer 11, and a second (structured) metallization layer 112 attached to the dielectric insulation layer 11. The dielectric insulation layer 11 is disposed between the first and second metallization layers 111, 112. It is, however, also possible that the semiconductor substrate 10 only comprises a first metallization layer 111, while the second metallization layer 112 is omitted.

Each of the first and second metallization layers 111, 112 may consist of or include one of the following materials: copper; a copper alloy; aluminum; an aluminum alloy; any other metal or alloy that remains solid during the operation of the power semiconductor module arrangement. The semiconductor substrate 10 may be a ceramic substrate, that is, a substrate in which the dielectric insulation layer 11 is a ceramic, e.g., a thin ceramic layer. The ceramic may consist of or include one of the following materials: aluminum oxide; aluminum nitride; zirconium oxide; silicon nitride; boron nitride; or any other dielectric ceramic. For example, the dielectric insulation layer 11 may consist of or include one of the following materials: $Al_2O_3$, AlN, SiC, BeO or $Si_3N_4$. For instance, the substrate 10 may be, e.g., a Direct Copper Bonding (DCB) substrate, a Direct Aluminum Bonding (DAB) substrate, or an Active Metal Brazing (AMB) substrate. Further, the substrate 10 may be an Insulated Metal Substrate (IMS). An Insulated Metal Substrate generally comprises a dielectric insulation layer 11 comprising (filled) materials such as epoxy resin or polyimide, for example. The material of the dielectric insulation layer 11 may be filled with ceramic particles, for example. Such particles may comprise, e.g., $Si_2O$, $Al_2O_3$, AlN, or BN and may have a diameter of between about 1 µm and about 50 µm. The substrate 10 may also be a conventional printed circuit board (PCB) having a non-ceramic dielectric insulation layer 11. For instance, a non-ceramic dielectric insulation layer 11 may consist of or include a cured resin.

The semiconductor substrate 10 is arranged in a housing. In the example illustrated in FIG. 1, the semiconductor substrate 10 is arranged on a ground surface 12 of the housing. The housing further comprises sidewalls 42 and a cover 44. In other examples, however, the ground surface 12 of the housing may be omitted. In such cases the semiconductor substrate 10 itself may form the ground surface of the housing. In such cases the semiconductor substrate 10 may be arranged on a heat sink, for example. In the example in FIG. 1, only one semiconductor substrate 10 is arranged on the ground surface 12. In some power semiconductor module arrangements, more than one semiconductor substrate 10 may be arranged in a single housing. The ground surface 12, the sidewalls 42 and the cover 44 may include a metal or a metal alloy, for example. It is, however, also possible that the ground surface 12, sidewalls 42 and cover 44 comprise an electrically insulating material such as a plastic or ceramic material, for example. The housing may also include a liquid crystal polymer, for example.

The semiconductor substrate 10 may be connected to the ground surface 12 by means of a connection layer (not specifically illustrated in FIG. 1). Such a connection layer may be a solder layer, a layer of an adhesive material, or a layer of a sintered metal powder, e.g., a sintered silver powder, for example. Any other kind of electrically conducting or non-conducting connection layer is also possible.

One or more semiconductor bodies 20 may be arranged on the semiconductor substrate 10. Each of the semiconductor bodies 20 arranged on the semiconductor substrate 10 may include a diode, an IGBT (Insulated-Gate Bipolar Transistor), a MOSFET (Metal-Oxide-Semiconductor Field-Effect Transistor), a JFET (Junction Field-Effect Transistor), a HEMT (High-Electron-Mobility Transistor), or any other suitable controllable semiconductor element.

The one or more semiconductor bodies 20 may form a semiconductor arrangement on the semiconductor substrate 10. In FIG. 1, only two semiconductor bodies 20 are exemplarily illustrated. The second metallization layer 112 of the semiconductor substrate 10 in FIG. 1 is a continuous layer. The first metallization layer 111 of the example in FIG. 1 is also a continuous layer. However, the first metallization layer 111, the second metallization layer 112 or both may also be structured layers. "Structured layer" means that, e.g., the respective metallization layer 111, 112 is not a continuous layer, but includes recesses between different sections of the layer. Different semiconductor bodies 20 may be mounted to the same or to different sections of the first metallization layer 111. Different sections of the first metallization layer 111 may have no electrical connection or may be electrically connected to one or more other sections using, e.g., bonding wires. Electrical connections may also include connection plates or conductor rails, for example, to name just a few examples. The one or more semiconductor bodies 20 may be electrically and mechanically connected to the semiconductor substrate 10 by an electrically conductive connection layer 22. Such an electrically conductive connection layer 22 may be a solder layer, a layer of an electrically conductive adhesive, or a layer of a sintered metal powder, e.g., a sintered silver powder, for example.

The power semiconductor module further includes terminal elements 30. The terminal elements 30 are electrically connected to the semiconductor substrate 10, e.g., to the first metallization layer 111 of the semiconductor substrate 10, and form a contact element which provides an electrical connection between the inside and the outside of the housing. A first end of the terminal elements 30 may be electrically and mechanically connected to the first metallization layer 111 by an electrically conductive connection layer (not specifically illustrated). Such an electrically conductive connection layer may be a solder layer, a layer of an electrically conductive adhesive, or a layer of a sintered metal powder, e.g., a sintered silver powder, for example. A second end of the terminal elements 30 protrudes out of the housing to allow the contact element to be electrically contacted from the outside. The cover 44 of the housing may comprise openings through which the terminal elements 30 may protrude such that their first side is inside the housing and their second side is outside the housing. The terminal elements 30 may protrude vertically out of the housing when the housing is arranged to surround the semiconductor substrate 10. According to another example, terminal elements 30 may also protrude horizontally through a sidewall 42 of the housing.

Figure 2:
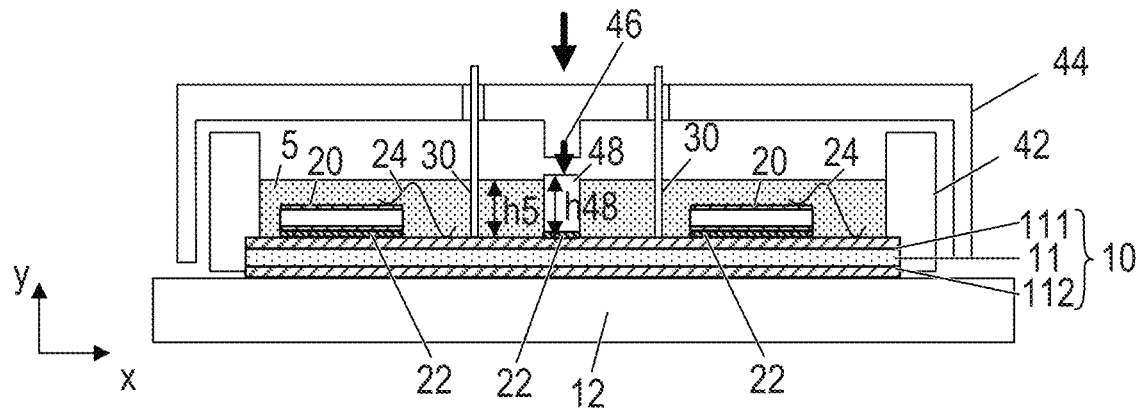
FIG. 2 is a cross-sectional view of a further example of a power semiconductor module arrangement.

A power semiconductor module may further include a casting compound 5, as is illustrated in the example of FIG. 2. The casting compound 5 may consist of or include a silicone gel or may be a rigid molding compound, for example. The casting compound 5 may partly fill the interior of the housing, thereby covering the semiconductor substrate 10 and the semiconductor bodies 20, and any other components and electrical connections 24 that are arranged on the semiconductor substrate 10. Electrical connections 24 such as, e.g., bonding wires or bonding ribbons, may electrically couple the semiconductor bodies 20 to the first metallization layer 111, to other semiconductor bodies 20, or to any other components that may be arranged inside the housing. The terminal elements 30 may be partly embedded in the casting compound 5. At least the second end of the terminal elements 30, however, may not be covered by the casting compound 5 and may protrude from the casting compound 5. The casting compound 5 is configured to protect the components and electrical connections inside the power semiconductor module arrangement, in particular inside the housing, from certain environmental conditions, mechanical damage and insulation faults.

The sidewalls 42 of the housing generally may be mechanically connected to the semiconductor substrate 10 by means of a joint (not specifically illustrated in the Figures). This joint may be a solder joint, a cold welding joint, or an adhesive joint, for example. Any other suitable joints are also possible to mechanically connect the sidewalls 42 of the housing to the semiconductor substrate, which also provide a suitable seal such that no, or at least less gasses may enter the housing 40. The sidewalls 42 and the ground surface 12 may also be provided as a single piece (not specifically illustrated). This means that there are no joints between the sidewalls 42 and the ground surface 12 of the housing.

The semiconductor module arrangement further comprises an end stop element 48. The end stop element 48 is arranged on the semiconductor substrate 10, for example. In the Figures, the end stop element is illustrated as being arranged at a certain distance from the different semiconductor bodies 20. This, however, is only an example. In other examples, the end stop element 48 may be arranged in close vicinity to at least one of the semiconductor bodies 20. In close vicinity in this context refers to a distance that is shorter than, e.g., 5 mm, 3 mm or 2 mm. According to another example, the end stop element 48 is arranged on a semiconductor body 20 instead of on the semiconductor substrate 10. If the end stop element 48 is arranged on a semiconductor body 20, the respective semiconductor body 20 is arranged between the end stop element 48 and the semiconductor substrate 10.

Figure 3:
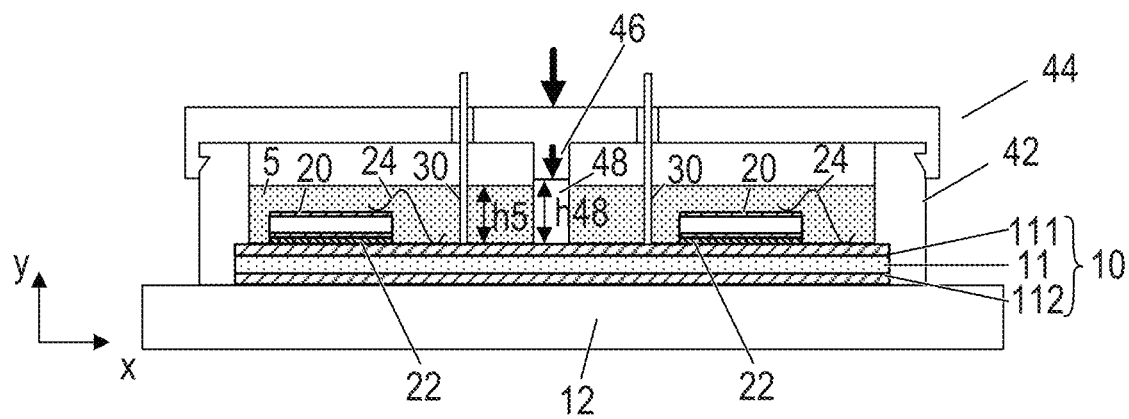
FIG. 3 is a cross-sectional view of a further example of a power semiconductor module arrangement.

When the semiconductor module arrangement is fully assembled, the semiconductor substrate 10 is pressed on the ground surface 12 of the housing in order to reduce a thermal resistance between the semiconductor substrate 10 and the ground surface 12. Even further, the semiconductor substrate 10 is kept in a desired position and is prevented from shifting inside the housing. A press-on pin 46 is coupled to the cover 44 of the housing or is integrally formed with the cover 44 of the housing. The press-on pin 46 may be coupled to the housing in any suitable way. For example, the press-on pin 46 may be coupled to the housing by means of an adhesive bond, or a screwed or bolted connection. When the cover 44 is arranged on the sidewalls 42 to close the housing, the press-on pin 46 contacts the end stop element 48 and exerts a pressure on the end stop element 48. While the semiconductor module arrangement illustrated in FIGS. 1 and 2 illustrates the cover 44 still partly open, FIG. 3 illustrates an example of a semiconductor module arrangement in a final mounting position (cover fully closed). The bold arrows in the Figures illustrate a direction in which the cover 44 and the press-on pin 46 are moved while closing the housing and a direction of the pressure exerted on the end stop element 48 once the housing is fully closed.

The semiconductor module arrangement illustrated in FIG. 1 does not comprise a casting compound 5. A casting compound, however, is illustrated in the examples of FIGS. 2 to 5. When the semiconductor module arrangement comprises a casting compound 5, the end stop element 48 is largely molded in the casting compound 5. However, a second end of the end stop element 48 facing away from the semiconductor substrate 10 or the semiconductor body 20 on which the end stop element 48 is mounted protrudes from the casting compound 5. Therefore, a top surface of the end stop element 48 facing away from the semiconductor substrate 10 or the semiconductor body 20 on which the end stop element 48 is mounted is not covered by the casting compound 5. In this way, the top surface may be easily contacted by the press-on pin 46, even if the casting compound 5 has already been formed. The press-on pin 46 then contacts the top surface of the end stop element 48 (but not the casting compound 5) and exerts pressure on the top surface, thereby pressing the end stop element 48 on the semiconductor substrate 10 (or on the semiconductor body 20) and subsequently pressing the semiconductor substrate 10 on the ground surface 12 of the housing. This allows the casting compound 5 to be formed even before the housing is fully closed, that is before arranging the cover 44 on the sidewalls 42.

The casting compound 5 may be formed when the sidewalls 42 are already arranged to surround the semiconductor substrate 10. The casting compound 5 is generally formed by forming a liquid or gel-like pre-layer. The sidewalls 42 prevent the material of the pre-layer from spreading unintentionally. A heating step may follow during which liquid that is present in the pre-layer is at least partly evaporated. In this way, the pre-layer is hardened to form the resulting casting compound 5. Such a heating step may either me performed before arranging the cover 44 on the sidewalls 42 or alternatively, the heating step may be performed after mounting the cover 44 on the sidewalls 42. When performing the heating step before mounting the cover 44 on the sidewalls 42, the cover 44 needs not be exposed to the heat applied during the heating step. This may increase the overall lifetime of the cover 44, and therefore of the complete semiconductor module arrangement, because the material of the cover 44 does not get fragile or brittle from being exposed to the heat.

The end stop element 48 may comprise a solid body, for example. That is, the end stop element 48 may comprise a main body that is completely formed of a solid block of suitable material. According to an example, the end stop element 48 may comprise a pin or cuboid having an angular or rounded cross-section. The casting compound 5 may then surround the end stop element 48. However, as the end stop element 48 does not have any cavities or holes, the casting compound 5 cannot intrude into the end stop element 48. According to another example, however, the end stop element 48 may comprise at least one cavity or hole such that the casting compound 5 may at least partly fill the cavity or hole. This will be described in further detail below with respect to FIGS. 6A-6B and 7.

In the examples illustrated in FIGS. 1 and 2, the sidewalls 42 of the housing are coupled to the semiconductor substrate 10 and the semiconductor substrate 10 is arranged on the ground surface 12 of the housing. The cover 44 in these examples comprises a top part, covering the opening formed by the sidewalls 42, and side parts which extend perpendicular to the top part and parallel to the sidewalls 42 of the housing when the cover 44 is arranged on the semiconductor substrate. The side parts of the cover 44 extend from the top part towards the ground surface 12. When the semiconductor module arrangement is fully assembled, the side parts may even contact the ground surface 12. For example, the side parts may be permanently coupled to the ground surface 12 in order to fix the cover 44 in place and prevent it from moving or even falling off. For example, the cover 44 may be soldered or glued to the ground surface 12.

This, however, is only an example. As is exemplarily illustrated in FIG. 3, it is also possible that the cover 44 is permanently attached to the sidewalls 42 of the housing only. The cover 44 may be glued to the sidewalls 42 or may be attached to the sidewalls by means of any suitable mechanic fixing mechanism. In the example illustrated in FIG. 3, the cover 44 comprises projections which engage with corresponding counterparts provided in the sidewalls 42.

Figure 5:
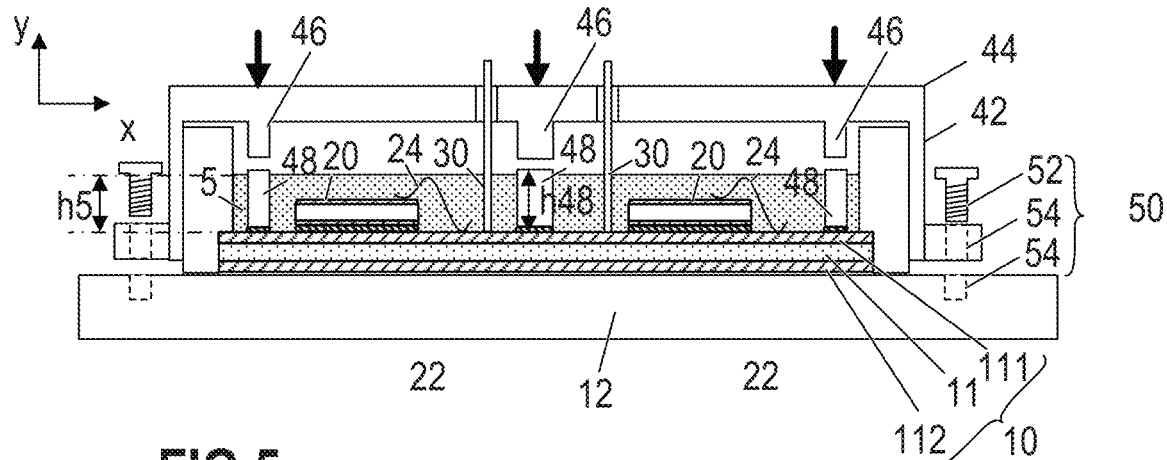
FIG. 5 is a cross-sectional view of a further example of a power semiconductor module arrangement.

The example illustrated in FIG. 5 is somewhat similar to the examples illustrated in FIGS. 1 and 2. However, in the example of FIG. 5 the side parts of the cover 44 comprise projections with threaded holes 54. The ground surface 12 may also comprise threaded holes 54. The cover 44 in this example may be attached to the ground surface 12 by means of screws or bolts 52 that are inserted into the threaded holes 54. However, any other way of permanently mounting the cover 44 on the sidewalls 42 is also possible.

Figure 4:
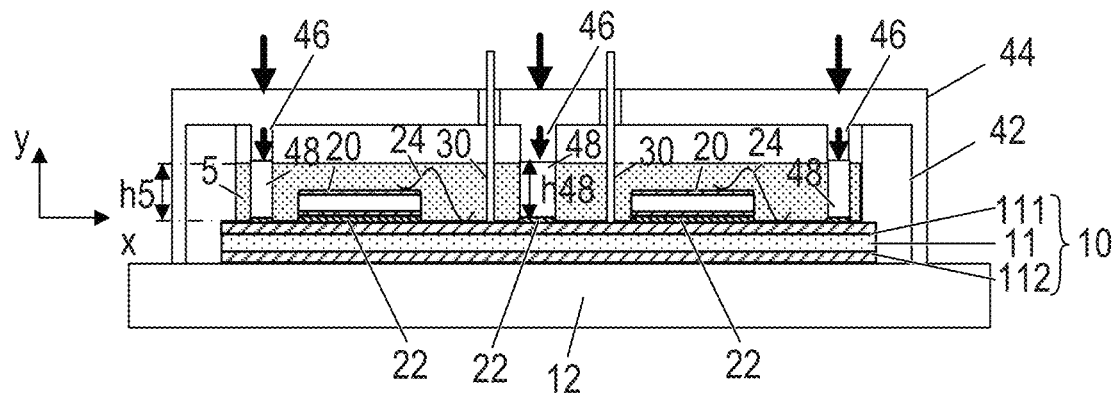
FIG. 4 is a cross-sectional view of a further example of a power semiconductor module arrangement.

In the examples illustrated in FIGS. 1, 2 and 3, the semiconductor module arrangement only comprises one end stop element 48 and one corresponding press-on pin 46 attached to the cover 44. This, however, is only an example. As is illustrated in FIGS. 4 and 5, the semiconductor module arrangement may also comprise more than one end stop element 48 and more than one corresponding press-on pin 46. In the examples illustrated in FIGS. 4 and 5, the semiconductor module arrangement comprises three end stop elements 48 and three press-on pins 46. However, any number n of end stop elements 48 and press-on pins 46 with n≥1 is generally possible. When providing more than one end stop element 48 and more than one corresponding press-on pin 46, the pressure exerted on the semiconductor substrate 10 may be distributed more evenly over the semiconductor substrate 10. However, a greater number of end stop elements 48 and press-on pins 46 increases the space requirements.

The end stop elements 48 may be formed of a rigid material. However, there is a risk that a pressure that is exerted on the semiconductor substrate 10 or the semiconductor body 20 on which the end stop element 48 is mounted becomes too high. This may damage the semiconductor body 20 and/or the semiconductor substrate 10. Therefore, the end stop element 48 may be at least partly elastic such that, when a pressure exerted to the end stop element 48 by the respective press-on pin 46 exceeds a predefined threshold, the end stop element 48 is compressed in order to limit a pressure exerted on the semiconductor substrate 10 or on the semiconductor body 20. That is, when the press-on pin 46 exerts pressure on the end stop element 48, the end stop element 48 remains in its original form as long as the pressure is below a certain threshold. Once the pressure exceeds the threshold, the end stop element 48 is compressed to a certain degree and changes from its original form to a compressed form.

According to one example, the end stop element 48 comprises a material that is stable up to a certain point but compresses when the pressure exceeds a certain threshold. The threshold depends on the kind of material that is used to form the end stop element 48. Some materials stay in the compressed form once the pressure is released, others return to their original form after releasing the pressure. According to another example, a compression of the end stop element 48 may result from a structural shape of the end stop element 48. That is, the material of the end stop element 48 by itself may not be compressible. However, the end stop element 48 may be bent or distorted to a certain degree under pressure.

Figures 6A, 6B:
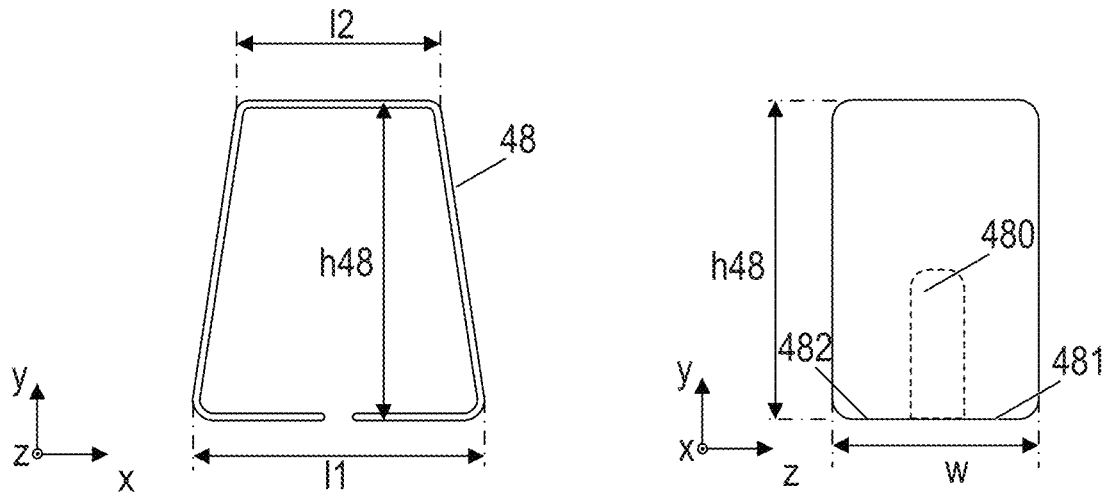
FIGS. 6A and 6B illustrate two different views of an end stop element according to an example.

One example of such an end stop element 48 is schematically illustrated in FIGS. 6A and 6B, wherein FIGS. 6A and 6B illustrate views of the end stop element 48 from different sides. The end stop element 48 illustrated in FIGS. 6A and 6B comprises a frame that surrounds a cavity or hollow space. The frame in the example illustrated in FIGS. 6A and 6B has a generally trapezoidal shape. That is, a top surface of the end stop element 48 which is in contact with the press-on pin 46 when the semiconductor module is fully assembled has a length l2 in a first horizontal direction x that is shorter than a length l1 of a lower surface. The lower surface of the end stop element 48 is the surface that is attached to the semiconductor substrate 10 or semiconductor body 20. As is illustrated in FIG. 6A, the lower surface may not be a continuous surface but may comprise a recess such that the lower surface is formed by two separate parts. Each of the two separate parts of the lower surface may be coupled to a different one of two side sections of the end stop element 48, the side sections coupling the top surface to the parts of the lower surface. In the side view illustrated in FIG. 6A, the cavity or hollow space is visible. The side view illustrated in FIG. 6B shows a side view of one of the side sections. The side sections may have a width w in a second horizontal direction z which is perpendicular to the first horizontal direction x. The width w of the side sections may be between 1 and 5 mm, for example. According to one example, the width w of the side sections is 1.5 mm. The end stop element 48 may have a height h48 of between 2.5 and 6 mm, for example. The length l2 of the top surface may be between 0.8 and 2 mm, for example, and the length l1 of the lower surface may be between 1.5 and 4 mm, for example. These dimensions, however, are merely examples. The dimensions of the end stop element 48 generally depend on the dimensions of the semiconductor module arrangement. The height h48 of the end stop element 48, for example, may be higher than a height h5 of the casting compound 5 formed in the housing such that the top surface of the end stop element 48 is not covered by the casting compound 5.

The structural shape of the end stop element 48 illustrated in FIGS. 6A and 6B allows the end stop element 48 to bend or distort when a pressure exerted on the top surface exceeds a certain threshold. The bending, however, may mainly take place in those sections of the end stop element 48 that are arranged above and are not covered by the casting compound 5. As the casting compound 5 is hardened during the process of assembling the semiconductor module arrangement, the casting compound 5 itself does not deform at all or only to a very limited extent. Damage of the casting compound 5 should be avoided in order to guarantee that the semiconductor substrate 10 and the elements mounted on the semiconductor substrate 10 are still sufficiently protected by the casting compound 5.

Figure 7:
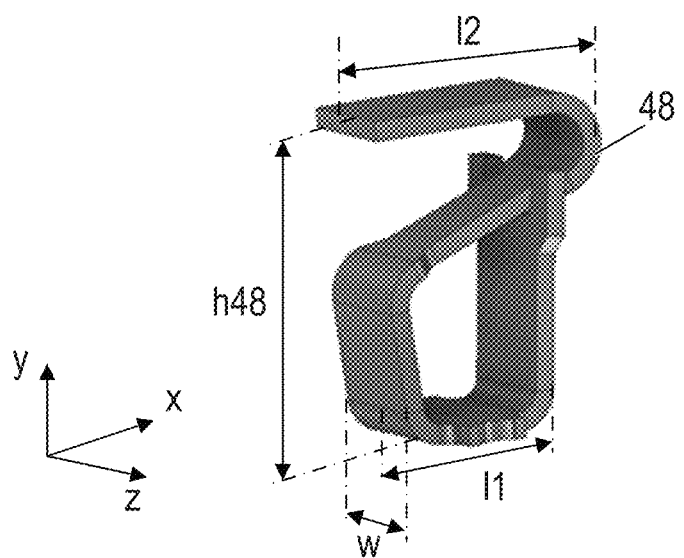
FIG. 7 is three-dimensional view of an end stop element according to another example.

Now referring to FIG. 7, another example of an end stop element 48 is schematically illustrated. In the example illustrated in FIG. 7, the length l2 of the top surface is larger than the length l1 of the lower surface. The frame of the end stop element 48 forms a lower part surrounding a cavity or hollow space, and an upper part that is bent in order to rest on the lower part. The top surface is connected to the lower part on one side only while the second side rests in free air. In this way the top surface is held in a springy fashion such that it may bend towards the semiconductor substrate 10 when the pressure exerted on the top surface exceeds a certain threshold. The specific form illustrated in FIG. 7, however, is only a further example. Any other forms of the end stop element 48 that exhibit the characteristics described above are generally possible.

The at least one end stop element 48 may comprise an electrically insulating material. However, according to another example it is also possible that the at least one end stop element 48 comprises an electrically conducting material. The at least one press-on pin 46 may also comprise an electrically conducting material. In this way, the at least one end stop element 48 and the corresponding press-on pins 46 may form contact elements which provide electrical connections between the inside and the outside of the housing. The press-on pins 46 may be electrically coupled to the outside of the housing by any suitable means, for example, to allow for the press-on pins 46 and end stop elements 48 to be contacted from the outside of the housing. Alternatively or additionally, it is also possible that internal electrical connections are formed by means of the end stop elements 48 and press-on pins 46. The press-on pins 46 and end stop elements 48 may replace at least some of the terminal elements 30, for example. It is also possible that only some, but not all, end stop elements 48 and press-on pins 46 are used as terminal elements, while other press-on pins 46 and end stop elements 48 are electrically insulating and do not serve as terminal elements.

As is schematically illustrated in dashed lines in FIG. 6B, the side sections of the end stop element 48 may comprise a recess 480 such that each side section comprises two separate contact surfaces 481, 482. Each of the contact surfaces 481, 482 may be mechanically and electrically coupled to the semiconductor substrate 10 or the semiconductor body 20. One end stop element 48, therefore, may comprise four contact surfaces, of which only two are visible in the side view illustrated in FIG. 6B. The second side section and, therefore, the third and fourth contact surfaces are concealed by the first side section that is visible in FIG. 6B.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power semiconductor module arrangement, comprising:
   at least one semiconductor substrate comprising a dielectric insulation layer and a first metallization layer attached to the dielectric insulation layer;
   at least one semiconductor body arranged on the first metallization layer;
   at least one end stop element arranged either on the semiconductor substrate or on one of the at least one semiconductor body and extending from the semiconductor substrate or the respective semiconductor body in a vertical direction that is perpendicular to a top surface of the semiconductor substrate;
   a housing at least partly enclosing the semiconductor substrate, the housing comprising sidewalls and a cover; and
   a casting compound covering the semiconductor substrate and partly filling the housing,
   wherein the housing further comprises at least one press-on pin extending from the cover of the housing towards one of the at least one end stop element, and exerting a pressure on the respective end stop element,
   wherein the casting compound has a thickness in the vertical direction,
   wherein the at least one end stop element has a height in the vertical direction that is greater than the thickness of the casting compound such that a top surface of the end stop element that faces away from the semiconductor substrate or the semiconductor body is not covered by the casting compound,
   wherein the at least one end stop element comprises a frame that encloses a hollow space or cavity,
   wherein the casting compound surrounds the frame and at least partly fills the hollow space or cavity.

2. The power semiconductor module arrangement of claim 1, wherein the at least one end stop element is at least partly elastic such that, when a pressure exerted to the end stop element by the respective press-on pin exceeds a predefined threshold, the end stop element is compressed in order to limit a pressure exerted on the semiconductor substrate or on the respective semiconductor body.

3. The power semiconductor module arrangement of claim 1, wherein the at least one end stop element comprises a solid body that is surrounded by the casting compound.

4. The power semiconductor module arrangement of claim 1, wherein the at least one press-on pin does not directly adjoin the casting compound.

5. The power semiconductor module arrangement of claim 1, wherein the at least one end stop element is soldered or sintered on the semiconductor substrate or the respective semiconductor body.

6. The power semiconductor module arrangement of claim 1, wherein:
   at least one of the end stop element comprises an electrically conducting material;
   the press-on pin directly adjoining the at least one end stop element comprises an electrically conducting material; and
   the at least one end stop element and the corresponding press-on pin form an electrical connection that is configured to electrically couple two semiconductor bodies or to electrically couple the semiconductor substrate or a semiconductor body to the outside of the housing.

7. The power semiconductor module arrangement of claim 1, wherein the at least one end stop element comprises a metal.

8. The power semiconductor module arrangement of claim 1, wherein the at least one press-on pin is integrally formed with the cover of the housing.

9. A method for producing a power semiconductor module arrangement, the method comprising:
   arranging at least one semiconductor body on a semiconductor substrate, the semiconductor substrate comprising a dielectric insulation layer and a first metallization layer attached to the dielectric insulation layer;
   arranging at least one end stop element either on the semiconductor substrate or on one of the at least one semiconductor body such that each of the at least one end stop elements extends from the semiconductor substrate or the respective semiconductor body in a vertical direction that is perpendicular to a top surface of the semiconductor substrate;

arranging the semiconductor substrate in a housing, leaving a cover of the housing open;

forming a layer of a casting compound such that the casting compound covers the semiconductor substrate and partly fills the housing, wherein the casting compound has a thickness in the vertical direction, wherein the at least one end stop element has a height in the vertical direction that is greater than the thickness of the casting compound such that a top surface of the end stop element that faces away from the semiconductor substrate or the semiconductor body is not covered by the casting compound; and after forming the layer of casting compound, arranging a cover on sidewalls of the housing, thereby closing the housing, wherein the housing comprises at least one press-on pin extending from the cover of the housing towards one of the at least one end stop element and exerting a pressure on the respective end stop element when the cover is arranged in a final mounted position, wherein the at least one end stop element comprises a frame that encloses a hollow space or cavity, wherein the casting compound surrounds the frame and at least partly fills the hollow space or cavity.

10. The method of claim 9, wherein forming the layer of casting compound comprises:

forming a pre-layer of liquid or gel-like casting compound on the semiconductor substrate; and performing a heating step that largely removes liquid from the pre-layer and hardens the pre-layer.

11. The method of claim 10, wherein the heating step is performed after forming the pre-layer and before arranging the cover on the sidewalls.

12. The method of claim 10, wherein the heating step is performed after forming the pre-layer and after arranging the cover on the sidewalls.

13. A power semiconductor module arrangement, comprising:

a semiconductor substrate comprising a dielectric insulation layer and a structured metallization layer attached to the dielectric insulation layer;

a semiconductor body arranged on the structured metallization layer;

an end stop element arranged either on the semiconductor substrate or on the semiconductor body and extending from the semiconductor substrate or the semiconductor body in a vertical direction that is perpendicular to a top surface of the semiconductor substrate;

a housing at least partly enclosing the semiconductor substrate, the housing comprising sidewalls and a cover; and a casting compound covering the semiconductor substrate and partly filling the housing, wherein the housing further comprises a press-on pin extending from the cover of the housing towards the end stop element, and exerting a pressure on the end stop element, wherein the casting compound has a thickness in the vertical direction, wherein the end stop element has a height in the vertical direction that is greater than the thickness of the casting compound such that a top surface of the end stop element that faces away from the semiconductor substrate or the semiconductor body is not covered by the casting compound, wherein the end stop element comprises a frame that encloses a hollow space or cavity, wherein the casting compound surrounds the frame and at least partly fills the hollow space or cavity.

14. The power semiconductor module arrangement of claim 13, wherein the end stop element comprises a solid body that is surrounded by the casting compound.

15. The power semiconductor module arrangement of claim 13, wherein the press-on pin does not directly adjoin the casting compound.

16. The power semiconductor module arrangement of claim 13, wherein the press-on pin is integrally formed with the cover of the housing.

* * * * *